United States Patent
Yim et al.

(10) Patent No.: US 10,953,593 B2
(45) Date of Patent: *Mar. 23, 2021

(54) MOLDING COMPOUND INCLUDING A CARBON NANO-TUBE DISPERSION

(71) Applicant: Micron Technology, Inc., Boise, ID (US)

(72) Inventors: Myung Jin Yim, San Jose, CA (US); Jason M. Brand, Placerville, CA (US)

(73) Assignee: Micron Technology, Inc., Boise, ID (US)

( * ) Notice: Subject to any disclaimer, the term of this patent is extended or adjusted under 35 U.S.C. 154(b) by 164 days.

This patent is subject to a terminal disclaimer.

(21) Appl. No.: 15/954,328

(22) Filed: Apr. 16, 2018

(65) Prior Publication Data
US 2018/0229421 A1 Aug. 16, 2018

Related U.S. Application Data

(60) Continuation of application No. 14/713,881, filed on May 15, 2015, now Pat. No. 9,950,464, which is a
(Continued)

(51) Int. Cl.
*H01B 1/24* (2006.01)
*B29C 59/16* (2006.01)
(Continued)

(52) U.S. Cl.
CPC ............ *B29C 59/16* (2013.01); *B29C 59/005* (2013.01); *B82Y 30/00* (2013.01); *H01L 23/295* (2013.01);
(Continued)

(58) Field of Classification Search
CPC ..... H01L 23/29; H01L 23/3128; H01L 24/45; H01L 24/48; H01L 24/73; H01L 24/1815; H01L 2924/1815
See application file for complete search history.

(56) References Cited

U.S. PATENT DOCUMENTS

| 4,753,863 A | 6/1988 | Spanjer |
| 5,738,915 A | 4/1998 | Fathi et al. |

(Continued)

FOREIGN PATENT DOCUMENTS

| CN | 1522281 A | 8/2004 |
| JP | 2003306607 A | 10/2003 |

(Continued)

OTHER PUBLICATIONS

"Korean Application Sereal No. 10-2009-0109826, Office Action dated Nov. 25, 2015", 3 pgs.

(Continued)

*Primary Examiner* — Hoa B Trinh
(74) *Attorney, Agent, or Firm* — Schwegman Lundberg & Woessner, P.A.

(57) ABSTRACT

Various embodiments disclose a molding compound comprising a resin, a filler, and a carbon nano-tube dispersion and methods of forming a package using the molding compound are disclosed. The carbon non-tube dispersion has a number of carbon nano-tubes with surfaces that are chemically modified by a functional group to chemically bridge the surfaces of the carbon nano-tubes and the resin, improving adhesion between the carbon nano-tubes and the resin and reducing agglomeration between various ones of the carbon nano-tubes. The carbon nano-tube dispersion achieves a low average agglomeration size in the molding compound thereby providing desirable electro-mechanical properties and laser marking compatibility. A shallow laser mark may be formed in a mold cap with a maximum depth of less than about 10 microns. Other apparatuses and methods are disclosed.

20 Claims, 3 Drawing Sheets

Related U.S. Application Data division of application No. 12/343,398, filed on Dec. 23, 2008, now Pat. No. 9,041,228.

(51) Int. Cl.

| | |
|---|---|
| *B29C 59/00* | (2006.01) |
| *B82Y 30/00* | (2011.01) |
| *H01L 23/544* | (2006.01) |
| *H01L 23/29* | (2006.01) |
| *H01L 23/31* | (2006.01) |
| *H01L 23/00* | (2006.01) |
| *B29K 507/04* | (2006.01) |
| *B29L 31/00* | (2006.01) |

(52) U.S. Cl.
CPC ........ *H01L 23/544* (2013.01); *B29K 2507/04* (2013.01); *B29L 2031/712* (2013.01); *H01L 23/3128* (2013.01); *H01L 24/45* (2013.01); *H01L 24/48* (2013.01); *H01L 24/73* (2013.01); *H01L 2223/54406* (2013.01); *H01L 2223/54433* (2013.01); *H01L 2223/54486* (2013.01); *H01L 2224/05599* (2013.01); *H01L 2224/32225* (2013.01); *H01L 2224/45144* (2013.01); *H01L 2224/48091* (2013.01); *H01L 2224/48227* (2013.01); *H01L 2224/48465* (2013.01); *H01L 2224/73265* (2013.01); *H01L 2924/00014* (2013.01); *H01L 2924/12042* (2013.01); *H01L 2924/15183* (2013.01); *H01L 2924/15311* (2013.01); *H01L 2924/181* (2013.01); *H01L 2924/1815* (2013.01)

(56) References Cited

U.S. PATENT DOCUMENTS

| | | | |
|---|---|---|---|
| 5,973,263 | A | 10/1999 | Tuttle et al. |
| 6,238,597 | B1 | 5/2001 | Yim et al. |
| 6,989,412 | B2 | 1/2006 | Starkey |
| 7,339,280 | B2 | 3/2008 | Chuang et al. |
| 8,541,322 | B2 | 9/2013 | Barrera et al. |
| 8,585,753 | B2 * | 11/2013 | Scanlon ............... A61F 2/07 623/1.42 |
| 9,041,228 | B2 * | 5/2015 | Yim ..................... H01L 23/295 257/787 |
| 9,950,464 | B2 | 4/2018 | Yim et al. |
| 2006/0244955 | A1 | 11/2006 | Schramm et al. |
| 2010/0143732 | A1 | 6/2010 | Swift et al. |
| 2010/0283000 | A1 | 11/2010 | Shimizu et al. |
| 2011/0156255 | A1 | 6/2011 | Wyland et al. |
| 2015/0246479 | A1 | 9/2015 | Yim et al. |

FOREIGN PATENT DOCUMENTS

| | | |
|---|---|---|
| JP | 2005232247 A | 9/2005 |
| KR | 101666779 B1 | 10/2016 |
| TW | 200634073 | 10/2006 |
| TW | I450919 B | 9/2014 |
| WO | WO-2006057458 A1 | 6/2006 |

OTHER PUBLICATIONS

"Korean Application Serial No. 10-2009-0109826, Response filed Mar. 25, 2016 to Office Action dated Nov. 25, 2015", (English Translation of Claims), 21 pgs.

"Taiwanese Application Serial No. 070371, Office Action dated Mar. 5, 2013", w/English translation, 13 pgs.

"Taiwanese Application Serial No. 098140373, Re-examination Brief filed May 16, 2014", w/English claims, 9 pgs.

"Taiwanese Application Serial No. 098140373, Office Action dated Jul. 19, 2013", w/English translation, 15 pgs.

"Taiwanese Application Serial No. 098140373, Office Action dated Nov. 14, 2013", w/English translation, 7 pgs.

"Taiwanese Application Serial No. 098140373, Response filed May 31, 2013 to Office Action dated Mar. 5, 2017", w/English claims, 9 pgs.

"Taiwanese Application Serial No. 098140373, Response filed Oct. 23, 2013 to Office Action dated Jul. 19, 2013", w/English claims, 8 pgs.

Ma, Peng Cheng, et al., "Effects of silane functionalization on the properties of carbonnanotube/epoxy nanocomposites", Composites Science and Technology 67.14, (Nov. 2007), 2965-2972.

Ma, Peng Cheng, et al., "Functionalization of carbon nanotubes using a silane coupling agent", Carbon 44.15, (Dec. 2006), 3232-3238.

* cited by examiner

MOLDING COMPOUND INCLUDING A CARBON NANO-TUBE DISPERSION

PRIORITY APPLICATIONS

This application is a continuation application of U.S. application Ser. No. 14/713,881, filed May 15, 2018, which is a divisional patent application of U.S. application Ser. No. 12/343,398, filed Dec. 23, 2008, each of which are incorporated herein by reference in its entirety.

BACKGROUND

Embodiments of the invention relate to a molding compound including a carbon nano-tube dispersion. In particular, the present description refers to the manufacture of a molding compound for molded packages.

Epoxy resin molding compounds are widely used in microelectronic molded packages due to their inexpensive cost. For example, a lead frame with die bonding and wire bonding can be positioned in a mold cavity corresponding to a desired shape of a package to be produced, and an epoxy molding compound is charged into the mold cavity and a molding is then carried out. After molding, the molded package can be trimmed and further shaped for the outer leads.

The mold cap is then commonly laser marked with an alpha-numeric code for identification purposes. During laser marking an intense beam of light is scanned over the mold cap surface to write out the desired markings, or is projected onto the mold cap surface through a shadow mask containing an image of the desired markings. The intense beam of light burns, melts, ablates, or otherwise alters the surface of the mold cap to leave a visible imprint. The result is generally a color or texture change, or both.

DETAILED DESCRIPTION

Embodiments of the invention relate to a molding compound including a carbon nano-tube dispersion. In particular, the present description refers to the manufacture of a molding compound for molded packages.

Various embodiments described herein are described with reference to figures. However, certain embodiments may be practiced without one or more of these specific details, or in combination with other known methods and configurations. Reference throughout this specification to "one embodiment" or "an embodiment" means that a particular feature, configuration, composition, or characteristic described in connection with the embodiment is included in at least one embodiment of the invention. Thus, the appearances of the phrase "in one embodiment" or "an embodiment" in various places throughout this specification are not necessarily referring to the same embodiment of the invention. Furthermore, the particular features, configurations, compositions, or characteristics may be combined in any suitable manner in one or more embodiments.

Embodiments disclose a molding compound comprising: a resin, a filler, and a carbon nano-tube dispersion. In an embodiment, the carbon nano-tube dispersion includes a plurality of carbon nano-tubes with a 1-10 nm diameter and up to 100 nm length dispersed in the molding compound with an average agglomeration size less than one micron. In an embodiment, the carbon nano-tubes are functionalized to assist in inhibiting agglomeration by enhancing the compatibility between the carbon nano-tubes and surrounding resin. The molding compound composition provides desirable electro-mechanical properties such as low coefficient of thermal expansion (CTE), moderate glass transition temperature (Tg), low elastic modulus, low moisture absorption and high thermal conductivity. The molding compound may be formed into a mold cap for chip packaging. The molding compound allows the formation of a shallow laser mark in the mold cap with a maximum depth of less than 10 microns.

Figure 1:
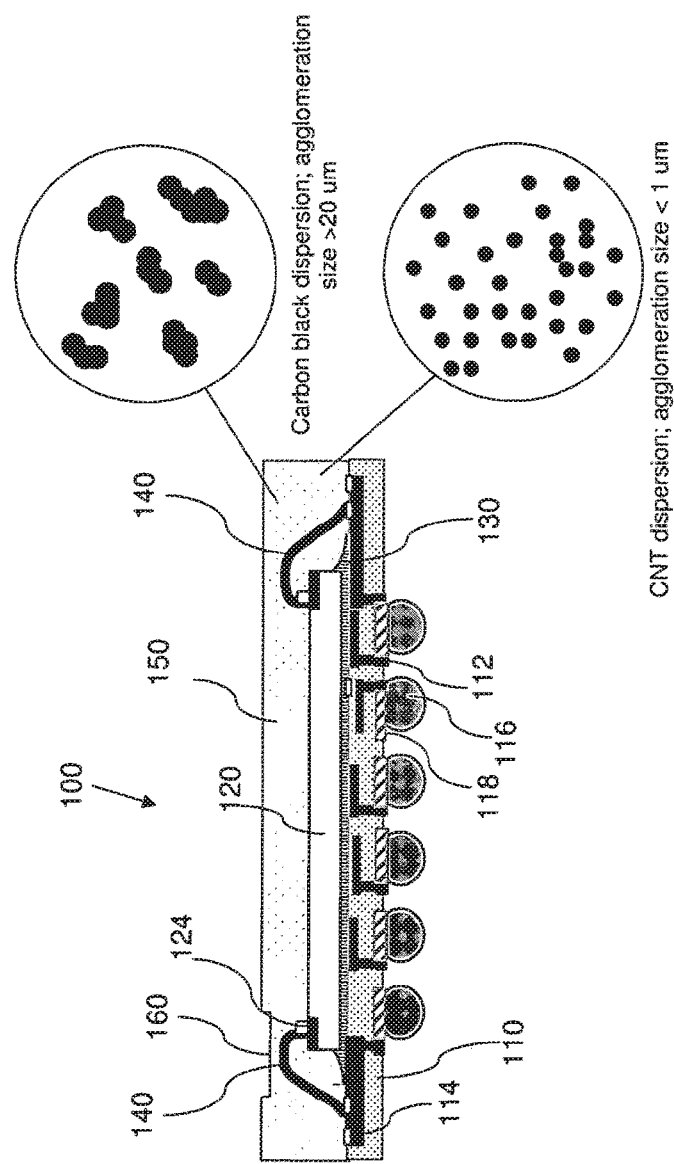
FIG. 1 is side view illustration of a molded chip package in accordance with an embodiment.

FIG. 1 is a side view illustration of a molded chip package in accordance with an embodiment. The molded chip package illustrated in FIG. 1 is a wire-bonded Plastic Ball Grid Array (PBGA) package, though embodiments of the present invention are not limited to such, and may be applied to other package designs such as, but not limited to, Molded Matrix Array Package (MMAP), Package on Package (PoP) and Thin Small Outline Package (TSOP), etc. As shown, the molded chip package 100 includes a substrate 110 upon which a chip 120 may be adhesively bonded with a die attach film 130 such as a filled epoxy, an unfilled epoxy, an acrylic, or a polyimide material.

The substrate 110 can be a printed wiring substrate with wire bonding pads 114 on a top surface and wiring 112 extending to a lower surface where solder balls 116 are mounted on ball bonding pads 118. In an embodiment, the substrate 110 comprises an electrically insulating material such as an organic polymer resin reinforced with glass fibers. The wire bonding pads 114 can be plated with metals such as nickel and gold to facilitate the wire bonding process. The ball bonding pads 118 can also be plated with a solder flux to facilitate attachment of solder balls 116.

Chip 120 may include a variety of devices. In an embodiment, chip 120 includes a volatile and/or nonvolatile memory device. For example, chip 120 may include any type of random access memory, a volatile memory, and/or a non-volatile memory such as a flash memory, phase change memory (PCM), phase-change random access memory (PRAM or PCRAM), ovonic unified memory (OUM) and chalcogenide random access memory (C-RAM). Chip 120 includes wire bonding pads 124. Wire bonding pads 124 can be plated with metal such as nickel and gold to facilitate the wire bonding process. A wire bond loop 140, such as a gold wire, connects a wire bonding pad 124 to wire bonding pad 114.

The molding compound may be formed into a mold cap 150 covering chip 120. The mold cap 150 may be formed from a variety of commercially available techniques such as injection molding. After formation of the mold cap 150, a top surface of the mold cap 150 may be laser marked to identify product data, for example. In an embodiment, mold cap 150 includes a laser mark 160 on a top surface having a maximum depth of less than 10 microns into the mold cap 150.

The mold cap 150 may be formed of a molding compound including a resin, a filler, and a carbon nano-tube dispersion. Suitable molding compound resins can be epoxies, silicones, and polyimides, for example. In an embodiment, the resin comprises approximately 10-30 wt % of the molding compound. Filler materials commonly used in molding compounds include silicon oxide in the form of powdered vitreous silica such as quartz, alumina and mixtures thereof. In an embodiment, the filler may comprise approximately 60-89 wt % of the molding compound.

The carbon nano-tube dispersion comprises a plurality of carbon nano-tubes. In an embodiment, the carbon nano-tubes have a diameter of 1-10 nm and a length of up to 100 nm. In an embodiment, the carbon nano-tube dispersion comprises 0.001-0.05 wt % of the molding compound. The substantially low concentration of carbon nano-tubes allows the ability to add a greater amount of filler if needed to control other properties of the molding compound, such as CTE.

In an embodiment, the carbon nano-tubes are functionalized to assist in inhibiting agglomeration. This can be done by chemical modification of the carbon nano-tube surfaces to chemically bridge the carbon surface and resin matrix. In an embodiment, the resin is an epoxy resin and the carbon nano-tubes are functionalized with epoxy group. For example a silane coupling agent is anchored to the surface of carbon nano-tubes with C—O—Si covalent bonding at the carbon nano-tube surface. A functional group such as an epoxy group can be bonded to the other end of the silane group to react with an epoxy curing agent in the molding compound. This surface functionalization improves the adhesion between individual carbon nano-tubes and the epoxy resin system and therefore improves the ultra-fine dispersion of carbon nano-tubes by inhibiting agglomeration of carbon nano-tubes.

The carbon nano-tube dispersions in accordance with embodiments of the present invention represent a significant improvement over state of the art molding compounds. A state of the art molding compound may typically comprise 0.1-5 wt % of a micron-sized carbon black powder or other masking pigment as a colorant and laser energy absorbing additive that decomposes, vaporizes or becomes colorless when exposed to laser energy. However, as shown in FIG. 1, these particles form agglomerations greater than 20 microns which introduces several problems. As a foremost problem, the large agglomerations require laser markings of at least 15-23 microns in depth. Carbon ablates during laser marking, and the poorly dispersed large agglomerates tend to explode which creates laser mark defects and poor overall resolution of laser marks. The low resolution, and necessary laser mark depth of 15-23 microns in turn represents a lower limit on mold cap height above the chip. In addition, large agglomerations increase the risk of shorting through the mold cap.

Embodiments of the present invention allow the formation of laser markings 160 with greater resolution, lower defects, and a maximum depth of less than 10 microns into the mold cap 150. The shallower depth of the laser markings 160 can additionally guard against unintentional exposure of a wire bond loop 140, and allows for the formation of a thinner mold cap 150 height above chip 120. In an embodiment, the height is within the range of approximately 50-150 microns. Embodiments of the present invention also provide the additional benefit of being able to provide and increased electrical resistance thereby lowering the risk of shorting. This is realized because of the lower overall wt %, nano-sized nano-tube, and agglomeration size of the carbon nano-tube dispersion. In an embodiment, functionalization of the carbon nano-tubes assists in dispersion of the carbon nano-tubes for reducing agglomeration size. Additional benefits include good colorization, good process compatibility, mechanical reliability including good warpage performance, electro-chemical reliability to low moisture absorption, higher thermal dissipation property when used for processor or logic device packaging, and good adhesion properties.

The molding compound according to embodiments of the invention can be formulated utilizing commercially available techniques. For example, carbon nano-tubes, filler, and epoxy curing agents can be mechanically mixed by ball milling or other manners for mixing known in the art. Typical epoxy curing agents include amine and imidazol curing agents. Additional additives such as adhesion promoters, coupling agents, dispersion agents, defoaming agents, and/or flame retardants may be included as is known in the art. The mixture may then be exposed to a low level partial cure and compressed into pellets. The pellets may then be fed into an injection molding apparatus for formation of the mold cap as is known in the art.

In an embodiment, functionalization of the carbon nano-tubes is done by chemical modification of carbon nano-tube surfaces to chemically bridge the carbon surface and resin matrix. Suitable chemical compounds include a silane coupling agent and 3-glycidoxypropyltrimethoxysilane (3-GPTMS; Aldrich, 99% purity). The silane process is done by purified and UV surface treated carbon nano-tubes immersed in silane solution during 6 hours at approximately 60-80 degree C. Then silane coupling agent is anchored to the surface of carbon nano-tubes and hydrolysis of silane coupling agent is performed resulting in C—O—Si covalent bonding at the carbon nano-tube surface. The other functional group, epoxy group for 3-GPTMS, is the other end, ready to react with epoxy curing agent in the compound. This surface functionalization improves the adhesion between individual carbon nano-tube and epoxy resin system and therefore improves the ultra-fine dispersion of carbon nano-tubes by inhibiting agglomeration of carbon nano-tubes. In an embodiment, the carbon nano-tubes are randomly dispersed in the epoxy resin system by mechanical mixing with the functionalized carbon nano-tubes in epoxy resin and epoxy curing agent.

In an embodiment, a mold cap comprising a molding compound in accordance with embodiments of the present invention is fabricated. An internal assembly is provided. The internal assembly may comprise a chip 120 adhesively bonded to a substrate 110. The internal assembly is then placed in a mold cavity. A molding compound in accordance with embodiments of the present invention is then provided to the molding cavity. In an embodiment, the molding compound includes a resin, filler, and a plurality of carbon nano-tubes. In an embodiment, the carbon nano-tubes are functionalized. The molding compound is then cured. In an embodiment, the cured molding compound covers or encapsulates the chip 120.

Curing of the molding compound may be performed with a thermal cure process, though is not so limited. In an embodiment, a microwave cure process may be used in place of, or in combination with, a typical thermal oven cure. In such an embodiment, the carbon nano-tube dispersion with an average agglomeration size below one micron can be more effective in heat absorption than a typical molding compound with micron sized carbon black having agglomerations of 20 microns or larger. During microwave heating the nano-sized carbon nano-tubes can serve as a uniform heating source, which provides for more uniform curing in less time than thermal oven curing, which is approximately 175 degree C. for more than 4 hours. This benefit is realized by the improved dispersion of carbon nano-tubes which provides uniform heating throughout the mold cap, and allows for the application of a microwave cure process. As a result, utilizing embodiments of the invention the molding process time can be reduced.

Figure 2:
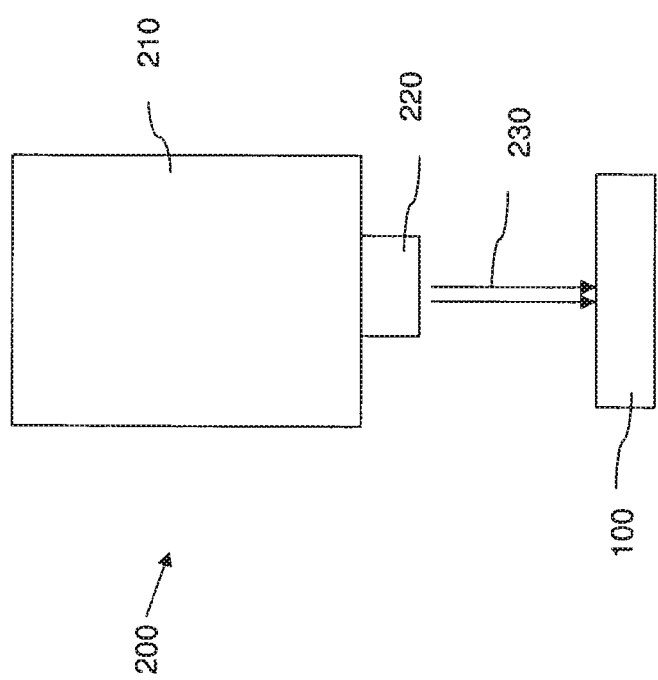
FIG. 2 is a side view illustration of a laser marking system in accordance with an embodiment.

In an embodiment, a molding compound in accordance with embodiments of the present invention is laser marked. The molding compound can be in the form of a mold cap. As shown in FIG. 2, a package 100 such as that illustrated in FIG. 1 having a portion formed from a molding compound is provided to a laser marking system 200. The laser marking system 200 may include a laser source 210 and lens 220 to direct a laser beam 230 to the top surface of package 100 having a portion formed from a molding compound. In an embodiment, the molding compound includes a resin, filler, and a plurality of carbon nano-tubes. In an embodiment, the carbon nano-tubes are functionalized. A portion of the molding compound is then irradiated with a radiation source to produce a laser mark 160, as illustrated in FIG. 1. In an embodiment, the radiation ablates the resin, the filler and the carbon nano-tube dispersion comprising the molding compound to form a laser mark having a maximum depth of less than 10 microns.

Figure 3:
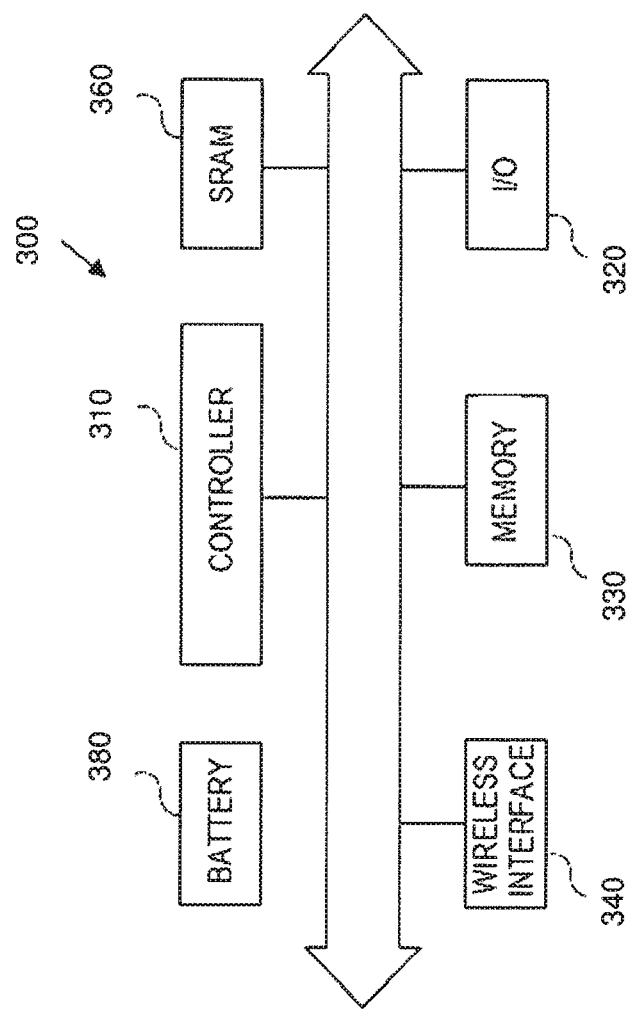
FIG. 3 is an illustration of a system in accordance with an embodiment.

Turning to FIG. 3, a portion of a system 300 in accordance with an embodiment of the present invention is described. System 300 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 300 may be used in any of the following systems: a wireless local area network (WLAN) system, a wireless personal area network (WPAN) system, a cellular network, although the scope of the present invention is not limited in this respect.

System 300 may include a controller 310, an input/output (I/O) device 320 (e.g. a keypad, display), static random access memory (SRAM) 360, a memory 330, and a wireless interface 340 coupled to each other via a bus 350. A battery 380 may be used in some embodiments. It should be noted that the scope of the present invention is not limited to embodiments having any or all of these components.

Controller 310 may comprise, for example, one or more microprocessors, digital signal processors, microcontrollers, or the like. I/O device 320 may be used by a user to generate a message. System 300 may use wireless interface 340 to transmit and receive messages to and from a wireless communication network with a radio frequency (RF) signal. Examples of wireless interface 340 may include an antenna or a wireless transceiver, although the scope of the present invention is not limited in this respect.

Memory 330 may be used to store messages transmitted to or by system 300. Memory 330 may also optionally be used to store instructions that are executed by controller 310 during the operation of system 300, and may be used to store user data. Memory 330 may be provided by one or more different types of memory. For example, memory 330 may comprise any type of random access memory, a volatile memory, and/or a non-volatile memory such as a flash memory, phase change memory (PCM), phase-change random access memory (PRAM or PCRAM), ovonic unified memory (OUM) chalcogenide random access memory (C-RAM).

In an embodiment, a chip including a nonvolatile memory array is packaged within any of the molding compounds described herein. Embodiments of the present invention are applicable to all molded packages such as, but not limited to, MMAP, PoP and TSOP etc. Volatile and nonvolatile memories may also be combined within a single chip or separate chips. For example, volatile and nonvolatile memories can be combined in a stacking process to reduce the footprint on a hoard, packaged separately, or placed in a multi-chip package with the memory component placed on top of the processor.

In the foregoing specification, various embodiments of the invention have been described. It will, however, be evident that various modifications and changes may be made thereto without departing from the broader spirit and scope of the invention as set forth in the appended claims. The specification and drawings are, accordingly, to be regarded in an illustrative sense rather than a restrictive sense. It is intended that the appended claims cover all such modifications and variations as fall within the true spirit and scope of this present invention.

What is claimed is:

1. A semiconductor package, comprising:
   a molding compound, including:
   a resin; and
   a number of carbon nano-tubes having surfaces that are chemically modified by a functional group, with reference to non-chemically modified carbon nano-tubes, the number of carbon nano-tubes with surfaces that are chemically modified by the functional group chemically bridge surfaces of the carbon nano-tubes and the resin to improve adhesion therebetween and reduce agglomeration between various ones of the number of carbon nano-tubes to an agglomeration size of less than about one micron, thereby increasing heat absorption of the molding compound.

2. The semiconductor package of claim 1, wherein the chemical modification includes a silane coupling agent anchored at one end to surfaces of the number of carbon nano-tubes and an opposing end of the silane coupling agent being bonded to the functional group.

3. The semiconductor package of claim 1, wherein the functional group is an epoxide group.

4. The semiconductor package of claim 1, further comprising a filler material comprising silica.

5. The semiconductor package of claim 1, wherein the resin comprises an epoxy.

6. The semiconductor package of claim 1, wherein the resin comprises an organic polymer resin reinforced with glass fibers.

7. The semiconductor package of claim 1, wherein the filler comprises between about 60 percent by weight to about 89 percent by weight of the molding compound.

8. The semiconductor package of claim 1, wherein the number of carbon nano-tubes comprises about 0.001 percent by weight to about 0.05 percent by weight of the molding compound.

9. The semiconductor package of claim 1, wherein a portion of the molding compound includes a mark on a surface of the semiconductor package, the mark having a depth of less than about 10 microns.

10. The semiconductor package of claim 1, wherein the agglomeration size of the carbon nano-tubes of less than about one micron is an average agglomeration size.

11. The semiconductor package of claim 1, wherein the molding compound comprises:
   the resin being about 10 percent by weight to about 30 percent by weight;
   the number of carbon nano-tubes being about 0.001 percent by weight to about 0.05 percent by weight; and
   the filler being about 60 percent by weight to about 90 percent by weight.

12. The semiconductor package of claim 1, further comprising at least one integrated circuit chip.

13. The semiconductor package of claim 12, wherein the molding compound is formed as a mold cap over at least one surface of the integrated circuit chip.

14. The semiconductor package of claim 1, wherein the number of carbon nano-tubes each have a diameter of about 1 nm to about 10 nm and a length of less than about 100 nm.

15. A package, comprising:
    an integrated circuit chip; and
    a mold cap covering the integrated circuit chip, the mold cap including a resin, a filler, and a carbon nano-tube dispersion having a number of carbon nano-tubes with surfaces that are chemically modified by a functional group, with reference to non-chemically modified carbon nano-tubes, the carbon nano-tubes with surfaces that are chemically modified by the functional group chemically bridge surfaces of the carbon nano-tubes and the resin to improve adhesion therebetween and reduce agglomeration between various ones of the number of carbon nano-tubes to an agglomeration size of less about than one micron, thereby increasing heat absorption of the molding compound, the number of carbon nano-tubes each having a diameter of about 1 nm to about 10 nm and a length of less than about 100 nm.

16. The package of claim 15, wherein the chemical modification includes a silane coupling agent anchored at one end to surfaces of the number of carbon nano-tubes to result in C—O—Si covalent bonding at the surfaces of the carbon nano-tubes, an opposing end of the silane coupling agent being bonded to the functional group.

17. The package of claim 16, wherein the chemical modification further includes 3-glycidoxypropyltlimethoxysilane.

18. The package of claim 15, wherein a height of the mold cap over the integrated circuit chip is from about 50 microns to about 150 microns.

19. A molding compound, comprising:
    a resin;
    a filler; and
    a carbon nano-tube dispersion having a number of carbon nano-tubes having surfaces that are chemically modified by a functional group, with reference to non-chemically modified carbon nano-tubes, the number of carbon nano-tubes with surfaces that are chemically modified by the functional group chemically bridge surfaces of the carbon nano-tubes and the resin to improve adhesion between the carbon nano-tubes and the resin and reduce agglomeration between various ones of the number of carbon nano-tubes to an average agglomeration size of less than about one micron, thereby increasing electrical resistance in the molding compound as compared with a number of agglomerated carbon nano-tubes, the number of carbon nano-tubes each having a diameter of about 1 nm to about 10 nm and a length of less than about 100 nm.

20. The molding compound of claim 18, wherein the number of carbon nano-tubes is about 0.001 percent by weight to about 0.05 percent by weight.

* * * * *